United States Patent
Hoogeveen et al.

(10) Patent No.: US 6,479,996 B1
(45) Date of Patent: Nov. 12, 2002

(54) MAGNETIC RESONANCE IMAGING OF SEVERAL VOLUMES

(75) Inventors: Romhild Martijn Hoogeveen; Diana Maria Francisca Geraats, both of Eindhoven; Tim Leiner; Kai Yiu J. A. M. Ho, both of Maastricht, all of (NL)

(73) Assignee: Koninklijke Philips Electronics, Eindhoven (NL)

( * ) Notice: Subject to any disclaimer, the term of this patent is extended or adjusted under 35 U.S.C. 154(b) by 37 days.

(21) Appl. No.: 09/613,226

(22) Filed: Jul. 10, 2000

(51) Int. Cl.$^7$ .................................................. G01V 3/00
(52) U.S. Cl. ........................ 324/309; 324/307; 324/312
(58) Field of Search ................................. 324/309, 307, 324/311, 312; 600/420

(56) References Cited

U.S. PATENT DOCUMENTS

| | | | | |
|---|---|---|---|---|
| 4,978,918 A | * | 12/1990 | Sakamoto | 324/309 |
| 5,168,226 A | * | 12/1992 | Hinks | 324/309 |
| 5,323,110 A | * | 7/1994 | Fielden et al. | 324/309 |
| 5,928,148 A | | 7/2000 | Wang et al. | 600/420 |

OTHER PUBLICATIONS

Application Guide for Gyroscan NT CompactPlus Addendum for Release 6.2, pp. 1–35.

"Three–Dimensional Contrast–Enhanced Moving–Bed Infusion–Tracking (MoBI–Track) Peripheral MR Angiography With Flexible Choice of Imaging Parameters for Each Field of View" by Tim Leiner et al., in Journal of Magnetic Resonance Imaging, 11:368–377(2000).

"MRA of the vessels of the pelvis and legs with automatic table movement (MobiTrak): results in 100 patients" by H.P. Busch et al. in MedicaMundi vol. 43, Issue 1(Mar. 1999).

\* cited by examiner

*Primary Examiner*—Edward Lefkowitz
*Assistant Examiner*—Brij B. Shrivastav
(74) *Attorney, Agent, or Firm*—John F. Vodopia

(57) ABSTRACT

A magnetic resonance imaging method involves acquisition of sets of magnetic resonance signals from several scan-volumes of an object. According to the invention different spatial approaches are taken in the scanning of the respective scan-volumes. In particular_respective scan-volumes include different numbers of scan-slices or scan slices of respective scan-volumes have different slice-thickness or scan-slices of respective scan-volumes have different fields-of-view or scan-slices of respective scan-volumes have different numbers of scanned points in k-space.

9 Claims, 2 Drawing Sheets

MAGNETIC RESONANCE IMAGING OF SEVERAL VOLUMES

BACKGROUND OF THE INVENTION

1. Field of the Invention

The invention relates to a magnetic resonance imaging method comprising acquisition of sets of magnetic resonance signals from several scan-volumes of an object.

2. Description of Related Art

Such a magnetic resonance imaging method and such a magnetic resonance imaging system are known from the U.S. Pat. No. 5,928,148.

The known magnetic resonance imaging method in particular pertains to MR-angiography which forms magnetic resonance images of a patient's blood-vessel system. In order to improve contrast of notably the patient's arteries, a contrast agent is administered. According to the known magnetic resonance imaging method magnetic resonance signals are acquired from a large region of interest by translating the patient to successive stations at which the respective sets of magnetic resonance signals are acquired. To this end, the receiver system of the known magnetic resonance imaging system comprises a stationary local receiver coil which is supported adjacent the patient to acquire the magnetic resonance signals. In an other embodiment of the known magnetic resonance imaging system the receiver system comprises a multi-segment local coil which is moveable with the patient and its coil-segments are sequentially switched into operation. At the successive stations, respective portions of the patient to be examined are moved into the field-of-view of the magnetic resonance imaging system. The respective scan-volumes are defined by the respective portions of the patient from which the respective coil-segments acquire magnetic resonance signals at the successive stations. It is noted that the cited US-patent shows a patient's leg which is surrounded by several sets of surface coils. The separate sets of surface coils include different geometrical volumes, however, this does not cause different scan-volumes for the respective sets of surface coils. Notably, the scan-volume is determined by the smallest distance in k-space between scanned points in k-space, i.e. the smallest wavevector difference in the magnetic resonance signals. The scan volume is determined by the magnitude of the temporary read-gradients and phase-encoding-gradients. According to the known magnetic resonance imaging method, the respective scan-volumes must be aligned so that the sets of magnetic resonance signals can be concatenated in order to form a single MR-image of the entire region of interest.

SUMMARY OF THE INVENTION

An object of the invention is to provide a magnetic resonance imaging method involving acquisition several sets of magnetic resonance signals which provides magnetic resonance images having a better diagnostic quality.

This object is achieved by the magnetic resonance imaging method according to the invention wherein different spatial approaches are taken in the scanning of the respective scan-volumes.

As different spatial strategies are employed for scanning of the various portions of the object, differences between the shapes of the respective portions of the object are more accurately taken into account. For example, in MR-angiography of the lower extremities (the patient's legs), the invention takes account of the different shapes of notably the bloodvessel structures of the patient's abdomen, upper and lower legs. The respective scan volumes are accurately matched to the portions of patient to be examined. Consequently, the magnetic resonance images which are reconstructed from the magnetic resonance signals have a better diagnostic quality, in that small details having little contrast are nevertheless rendered well visible. Notably, the scan-volumes are adjusted in that for the individual scan-volumes the imaging-volume and/or the resolution of the magnetic resonance imaging system are adjusted. These are achieved by setting the smallest separation of points scanned in k-space and the number of points scanned in k-space by accordingly controlling the temporary read-gradients and/or phase encoding gradients and the sampling intervals employed in the acquisition of the magnetic resonance signals. That is the region in k-space which is scanned and the density of sample points are adjusted for separate scan-volumes.

These and other aspects of the invention will be further elaborated with respect to the preferred embodiments as defined in the dependent Claims.

Spatial approaches in the scanning of the scan-volumes may be achieved in various ways. Preferably, the spatial scanning may involve scanning of a number of slices in the respective scan-volumes. According to the invention, the number of slices employed in the individual scan-volumes is adjusted to the portion of the patient to be examined at issue. As portions of the patient to be examined are larger, larger scan-volumes with more slices are employed. Consequently, good coverage of the entire region of interest is achieved and superfluous scanning of empty, uninteresting or irrelevant space is avoided. Notably, the time required for acquisition of magnetic resonance signals from relatively small scan-volumes is reduced. As the time required for signal acquisition is shorter, the signal acquisition may be completed before the injected contrast agent reaches the patient's venous system. Hence, magnetic resonance signals from the patient's veins are avoided so that venous enhancement is avoided in the magnetic resonance image which is reconstructed from the magnetic resonance signals. Thus, it is avoided that the representation of the patient's arteries in the magnetic resonance image is obscured by magnetic resonance signals from veins that have become filled with contrast agent.

Alternatively, the slice thickness may be changed. This adjusts the spatial resolution in the direction transverse to the slices; this direction is usually indicated as the 'slice direction'. Further, within the slices for respective scan-volumes the field-of-view and the scan matrix, i.e. the number of samples and the sample density in k-space may be varied. Thus, the size of the scan-volume and the resolution in parallel to the slices is adjusted for the individual scan-volumes. The field-of-view is the region in the slice at issue from which magnetic resonance signals are acquired and is determined by the temporary magnetic read-gradients and phase-encoding gradients. The scan matrix is a two-dimensional matrix of which the entries represent the sample points (in k-space) are determined by the read gradients and phase-encoding gradients. So that the spatial resolution in the direction parallel to the slices is varied Hence, according to the invention, the size of the scan-volume and the resolution in all directions can be adjusted for the individual scan-volumes.

Further, contrast parameters that influence the contrast and/or signal-to-noise in the reconstructed magnetic resonance image may be adjusted for separate scan-volumes. Notably, these contrast parameters include the repetition rate, the echo-time, the flip-angle and the bandwidth employed in the pulse sequences of RF-excitations and temporary gradient used for scanning the scan-volumes for magnetic resonance signals.

In an other preferred implementation of the invention, the relative orientations of the scan-volumes are adjustable. Adjusting the relative orientations of the respective scan-volumes achieves accurate matching of the scan-volumes to the anatomy of the patient to be examined. The individual scan-volumes are oriented in the same way as the local orientation of the portion of the patient to be examined scanned in the relevant scan-volume. Individual scan-volumes have a longitudinal axis, for example the direction of the largest size of the scan-volume at issue. The orientations of the scan-volumes are for example obtained by adjusting the directions of the respective longitudinal axes of the respective scan-volumes to the portions of the patient to be examined. Thus, it is achieved that the scan-volumes adequately follow the shape of the portions of the patient of interest. Notably, in MR-angiography of the lower extremities, this preferred implementation takes account of the fact that the patient's abdominal region and legs and in particular the bloodvessel structure in those region, are not straight.

Preferably, the magnetic resonance signals are generated and acquired in the respective scan-volumes by respective ways of scanning k-space. The term k-space indicates the reciprocal space of the scan-volumes and positions in k-space represent the wavevectors of the magnetic resonance signals. The scanning of k-space is adapted for the respective scan-volumes. For example, some scan-volumes are scanned from the centre of k-space towards the periphery of k-space, other scan-volumes are scanned according to moving inward in k-space. In particular, as the scan-volume relates to a more extreme part of the patient's anatomy, e.g. the lower legs, scanning k-space from the centre outward effectively suppresses magnetic resonance signals from the patient's veins. Preferably, for the first scan-volume, i.e. the scan-volume in which the injected contrast agent arrives first, the magnetic resonance signals are acquired by scanning continuously through the centre of k-space. In this respect, continuously scanning implies that the change of the co-ordinates in k-space (i.e. the values of the vector components in k-space) between points in k-space that are scanned one immediately after the other is equal to the smallest co-ordinate change between scanned points in k-space. For instance, after a full read-out of samples in the $k_x$-direction, the next value of either $k_y$ or $k_z$ is take at a smallest sampling step from the earlier position in k-space. Particularly good results are obtained by scanning through the centre of k-space linearly, i.e. the values of the one or several of the vector-components of the k-vector changes linearly with time in a neighbourhood of the centre of k-space. As the contrast increases gradually during the k-space scanning of the individual scan-volumes, continuous scanning achieves that differences between contrast-values at neighbouring scanned positions in k-space remain small. Thus, artefacts in the magnetic resonance image due to large contrast differences at closely separated positions in k-space are avoided. Moreover, the linear scanning appears rather insensitive to accurate timing of the start of the scan relative to the arrival of contrast agent. Hence, it is easily achieved to scan the peripheral portions of k-space while contrast agent has arrived in the scan-volume without serious artefacts being generated. Hence, a high spatial resolution of the magnetic resonance image is achieved. The first scan-volume usually relates to the abdominal region of the patient to be examined. In practice it appears that high spatial resolution of the magnetic resonance image of the abdominal region is relevant in view of the diagnostic quality of the magnetic resonance image of the abdominal region. Furthermore, continuous, in particular linear scanning in k-pace for the first scan-volume involves a relative rapid progress of the scanning of k-space, i.e. more rapid as compared to a so-called high-low strategy in which the sign of at least one of the components of the k-vector is alternated between and positive and negative values for points in k-space that are scanned one after the other and the magnitude of the k-vector gradually decreases from the periphery to the centre of k-space. Hence, the scanning of k-space for the first scan-volume only takes a relative small amount of time to reach the centre of k-space. Thus, magnetic resonance signals at low k-values from the patient's veins are avoided since the contrast agent has not yet reached the patient's veins when the centre of k-space is scanned quite soon after the injection of contrast agent. That is, the so-called venous enhancement is substantially suppressed by continuous, or linear scanning in k-space for the first scan-volume.

The time required for scanning k-space for the first scan-volume may be further reduced by employing a partial scanning of k-space in that in the periphery of k-space, i.e. k-vectors having a large magnitude of one of more of its $k_x,k_y,k_z$ components, only positive or only negative values of one or more of these components are scanned. Then the magnetic resonance signals for parts of k-space which is not actually scanned and which are needed for reconstruction of the magnetic resonance image are obtained e.g. by hermitian conjugation from actually acquired magnetic resonance signals. Thus, venous enhancement in the first scan-volume is even further suppressed.

The scanning of k-space for subsequent scan-volumes is preferably performed according to the so-called low-high scanning in which the sign of at least of the components of the k-vector is alternated between and positive and negative for points in k-space that are scanned one after the other and the magnitude of the k-vector gradually increases from the centre to the periphery of k-space. This low-high strategy achieves that portions of k-space having low wave-numbers (k-values) are scanned earlier than portions of k-space at high k-values. Consequently, venous enhancement, i.e. venous signal contributing to the magnetic resonance signals appears only at high k-values which leads to suppression of the venous contribution of the contrast in the magnetic resonance image. These subsequent volumes are scanned after the increase of the contrast so that the contrast is rather stable during the scanning of these subsequent volumes.

The invention also relates to a magnetic resonance imaging system. The magnetic resonance imaging system according to the invention is defined in the independent claim 6. The magnetic resonance imaging system of the invention is suitable for carrying-out the magnetic resonance imaging method of the invention. This is in practice achieved by suitably programming a computer or micro-processor which controls the magnetic resonance imaging system.

The invention further relates to a computer programme as defined in the independent claim 7. The computer programme according to the invention enables the magnetic resonance imaging system to achieve the technical effects involved in performing the magnetic resonance imaging method of the invention. The computer programme is loaded in the computer of micro-processor of the magnetic resonance imaging system.

BRIEF DESCRIPTION OF THE DRAWINGS

These and other aspects of the invention will be elucidated with reference to the embodiments described hereinafter and with reference to the accompanying drawing wherein.

DETAILED DESCRIPTION

Figure 1:
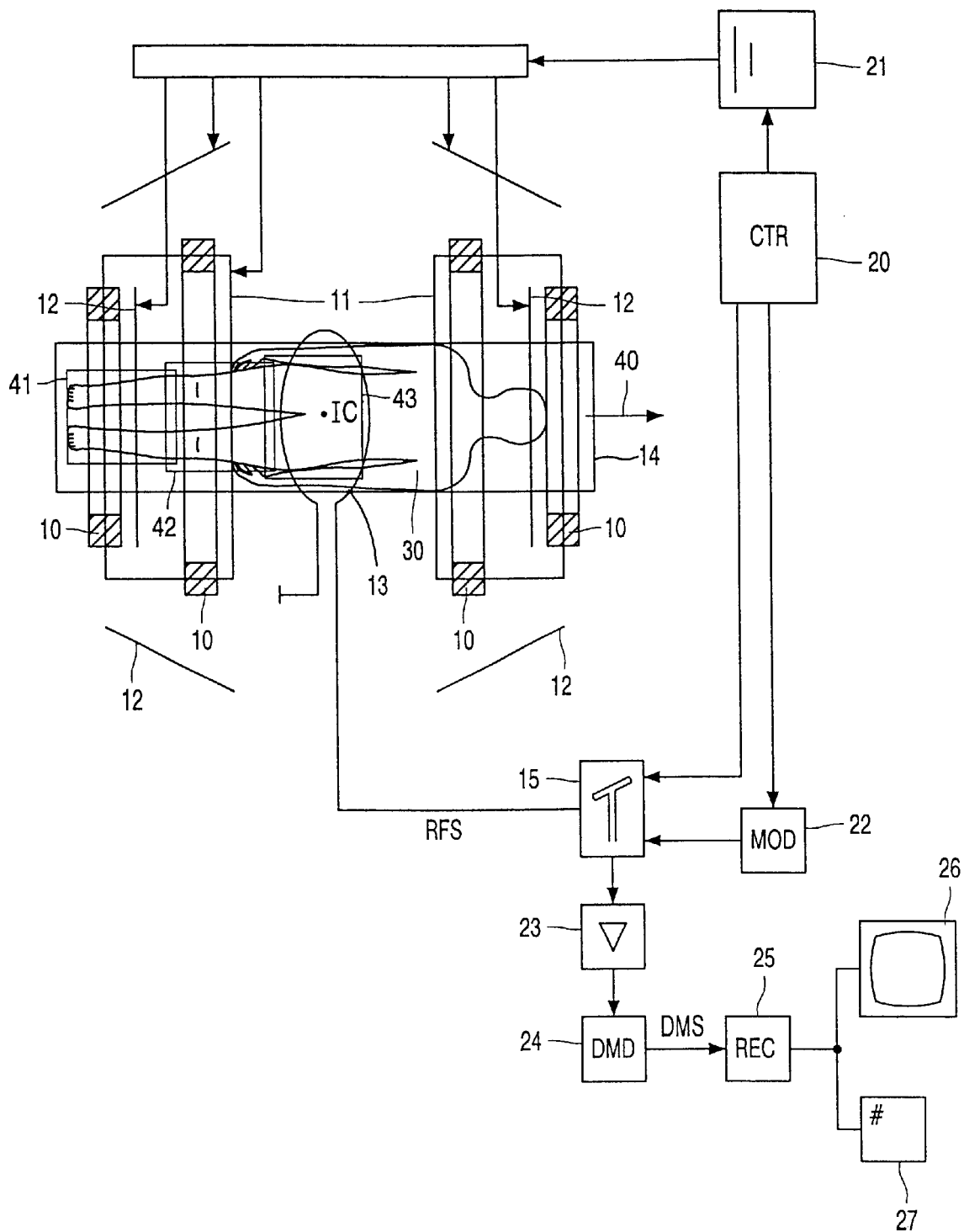
FIG. 1 shows a schematic representation of the magnetic resonance imaging system in which the invention is employed.

FIG. 1 shows diagrammatically a magnetic resonance imaging system in which the invention is used. The magnetic resonance imaging system includes a set of main coils 10 whereby the steady, uniform magnetic field is generated. The main coils are constructed, for example in such a manner that they enclose a tunnel-shaped examination space. The patient to be examined is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a controllable power supply unit 21. the gradient coils 11, 12 are energised by application of an electric current by means of the power supply unit 21. The strength, direction and duration of the gradients are controlled by control of the power supply unit. The magnetic resonance imaging system also includes transmission and receiving coils 13 for generating the RF excitation pulses and for acquiring the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is usually used alternately as the transmission coil and the receiving coil. Such a coil is usually indicated as a 'synergy-coil'. Furthermore, the transmission and receiving coil is usually shaped as a coil, but other geometries where the transmission and receiving coil acts as a transmission and receiving antenna for RF electromagnetic signals are also feasible. The transmission and receiving coil 13 is connected to an electronic transmission and receiving circuit 15.

It is to be noted that it is alternatively possible to use separate receiving coils. For example, surface coils can be used as receiving coils. Such surface coils have a high sensitivity in a comparatively small volume. The transmission coils, such as the body coil and then surface coils, are connected to a demodulator 24 and the received magnetic resonance signals (MS) are demodulated by means of the demodulator 24. The demodulated magnetic resonance signals (DMS) are applied to a reconstruction unit. The receiving coil is connected to a preamplifier 23. The preamplifier 23 amplifies the RF resonance signal (MS) received by the receiving coil 16 and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction monitor 26, so that the monitor can display the magnetic resonance image. It is alternatively possible to store the signal from the reconstruction unit 25 in a buffer unit 27 while awaiting further processing.

According to the invention, the patient table 14 with the patient 30 are moved to successive stations and at each station, as indicated by the arrow 40 In practice at the first station, the abdominal region of the patient is scanned, at the second station the upper legs of the patient are scanned and at the third station the lower legs of the patient are scanned. At each station the magnetic resonance signals from the scan-volume at issue are acquired and magnetic resonance images are reconstructed. The scan-volumes are indicated by the reference numerals 41,42 and 43. The patient is shown in its position at the first station 43 in which the first scan-volume of the abdominal region is positioned such that the isocentre IC of the magnetic resonance imaging system is located in the first scan-volume 43. Subsequently, the patient table 14 with the patient are moved so that the second scan-volume 42 and the third scan-volume 43 are placed at the isocentre IC. As is indicated schematically in FIG. 1, the magnetic gradient fields are adjusted at each station in order that the field-of-view matches the local size of the patient at the respective stations.

The magnetic resonance images may be actual two-dimensional images, but also three-dimensional volumes may be reconstructed for the individual scan-volumes. The reconstruction unit 25 is preferably also arranged to combine the reconstructed images or volumes into an overview image or an overview volume which represents the patients vascular system in the lower extremities. Notably, such an overview shows the arterial system with a high diagnostic quality and a high spatial resolution.

The magnetic resonance imaging system according to the invention is also provided with a control unit 20, for example in the form of a computer which includes a (micro) processor. The control unit 20 controls the execution of the RF excitations and the application of the temporary gradient fields. To this end, the computer program according to the invention is loaded, for example, into the control unit 20 and the reconstruction unit 25.

Figure 2:
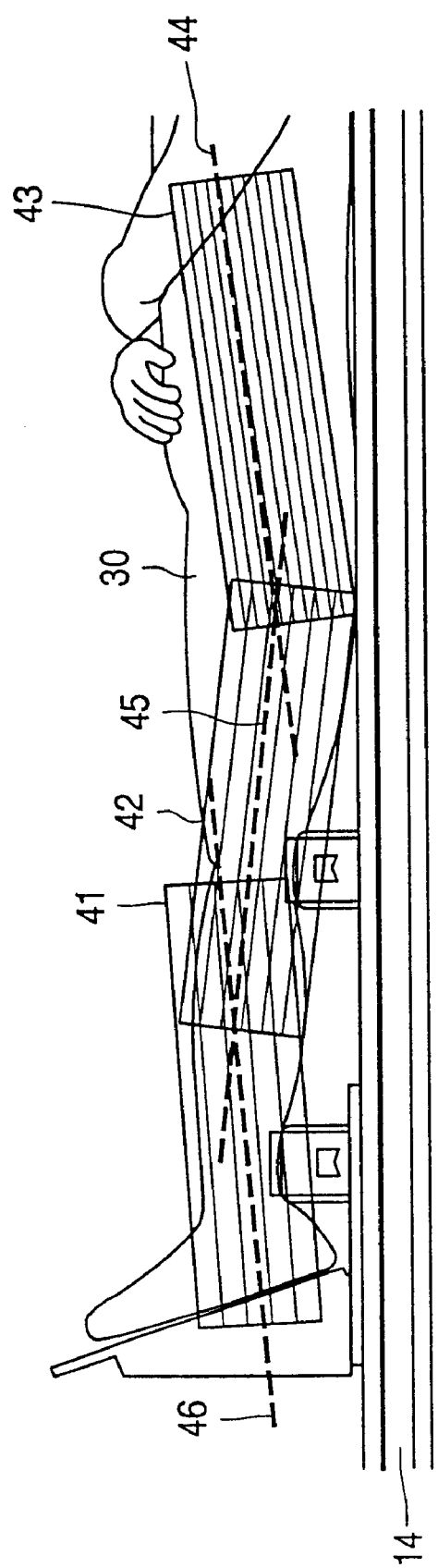
FIG. 2 shows a schematic representation of the orientation of respective scan volumes according to the invention.

FIG. 2 shows a schematic representation of the orientation of respective scan volumes according to the invention. In particular, FIG. 2 shows a side-elevation of the patient 30 to be examined on the patient table 14 and in which the respective scan-volumes 43,42 and 41 are indicated. According to the invention the scan-volumes are oriented, for example such that each scan-volume is aligned along the portion of the patient at issue in that scan-volume. Consequently, in this embodiment, the longitudinal axes 44,45,46 of the scan-volumes 41,42,43 are not along a common direction since the patient's legs are not straight. However, according to the invention, it is also possible to optionally align the scan-volumes such that their longitudinal axes are all along a common direction. Such an alignment along the common direction makes it easier to concatenate the magnetic resonance images of the scan-volumes into a single magnetic resonance image.

Further, as is schematically indicated in FIG. 2, the number of slices which are scanned for magnetic resonance signals is different for individual scan-volumes. For example, the first scan-volume 43, which relates to the abdominal region, contains about 30–33 slices, the second scan-volume 42, which relates to the upper legs, contains about 20–22 slices and the third scan-volume 41, which relates to the lower legs contains about 19–23 slices. The number of slices employed is selected in these ranges and depends on the patient at issue.

What is claimed is:

1. A magnetic resonance imaging method comprising the steps of:
 acquisition of sets of magnetic resonance signals from several scan-volumes of an object, wherein based upon characteristics of portions of the object to be analyzed, said portions corresponding to respective scan-volumes, a particular spatial approach of analysis of each respective scan-volume is employed, and wherein the k-space of the scan-volumes are scanned in accordance with characteristics of the portion of the object to be scanned for acquiring the magnetic resonance signals from the respective scan-volumes.

2. A magnetic resonance imaging method as claimed in claim 1, wherein
 each respective scan-volume includes several scan-slices and the particular spatial approach of analysis includes determining, for each scan-volume, at least one of:
 numbers of scan-slices,
 slice-thickness,
 fields-of-view, and
 numbers of scanned points of k-space.

3. A magnetic resonance imaging method as claimed in claim 1, wherein the respective scan-volumes have different orientations.

4. A magnetic resonance imaging method as claimed in claim 1, wherein the relative orientations of the scan-volumes are adjustable.

5. A magnetic resonance imaging method as claimed in claim 1, wherein the characteristics of the portion of the object include at least one of an orientation with respect to a reference, a thickness of the portion of the object, and a shape of the portion of the object.

6. A magnetic resonance imaging method as claimed in claim 1, further comprising the step of adjusting contrast parameters for each of the several scan volumes.

7. A magnetic resonance imaging method as claimed in claim 6, wherein the contrast parameters include repetition rate, echo-time, flip-angle and bandwidth employed in pulse sequences of RF-excitations and temporary gradient used for scanning the several scan-volumes.

8. A magnetic resonance imaging system comprising:
 a receiver system for receiving sets of magnetic signals from several scan-volumes of an object, and
 a scanning system for scanning the scan-volumes, wherein
 the scanning system is arranged such that a particular spatial approach of analysis of a portion of the object, said portion corresponding to a respective scan-volume, is employed based upon characteristics of the respective scan-volume to be analyzed.

9. A computer program embodied on a computer-readable medium for magnetic resonance imaging comprising:
 computer readable program code means for, receiving sets of magnetic resonance signals from several scan-volumes of an object, and
 computer readable program code means for, based upon characteristics of a portion of the object to be analyzed, said portion corresponding to a respective scan-volume, a particular spatial approach of analysis of the respective scan-volume is employed.

\* \* \* \* \*